US008273997B2

(12) United States Patent
Delfeld et al.

(10) Patent No.: US 8,273,997 B2
(45) Date of Patent: Sep. 25, 2012

(54) ANTIREFLECTIVE APPARATUS WITH ANISOTROPIC CAPACITIVE CIRCUIT ANALOG SHEETS

(75) Inventors: Thomas Peter Delfeld, Newcastle, WA (US); Nicole L. Dehuff, Seattle, WA (US)

(73) Assignee: The Boeing Company, Chicago, IL (US)

( * ) Notice: Subject to any disclaimer, the term of this patent is extended or adjusted under 35 U.S.C. 154(b) by 709 days.

(21) Appl. No.: 12/355,212

(22) Filed: Jan. 16, 2009

(65) Prior Publication Data

US 2010/0181106 A1 Jul. 22, 2010

(51) Int. Cl.
*H05K 1/16* (2006.01)
*H05K 9/00* (2006.01)

(52) U.S. Cl. .......................................... 174/350; 174/260

(58) Field of Classification Search ................... 174/350
See application file for complete search history.

(56) References Cited

U.S. PATENT DOCUMENTS 5,258,626 A * 11/1993 Suzuki et al. ................. 505/181
5,453,328 A * 9/1995 Nagano et al. ................ 428/545
5,488,371 A * 1/1996 Targove ............................ 342/1
5,744,537 A 4/1998 Brunsvold et al.
6,057,080 A 5/2000 Brunsvold et al.
6,225,215 B1 5/2001 Taravade et al.
6,309,789 B1 10/2001 Takano et al.
6,692,892 B1 2/2004 Takano et al.
6,739,028 B2 * 5/2004 Sievenpiper et al. ........ 29/25.42
7,057,479 B2 * 6/2006 Furuya et al. ................. 333/202
7,071,889 B2 * 7/2006 McKinzie et al. ............ 343/756
7,087,523 B2 * 8/2006 Grigoropoulos et al. ..... 438/662
7,335,456 B2 2/2008 Li et al.
2004/0028369 A1 * 2/2004 Aylward et al. ............... 385/145
2006/0139783 A1 6/2006 Decroupet
2006/0205140 A1 * 9/2006 Wofford et al. ............... 438/239
2007/0296032 A1 * 12/2007 Stumbo et al. ................ 257/347
2008/0034866 A1 * 2/2008 Kilic et al. ................. 73/514.26
2008/0038666 A1 2/2008 Wu et al.
2008/0084259 A1 * 4/2008 Yoshida et al. ............... 333/243
2008/0212914 A1 * 9/2008 Marks et al. ....................... 385/2
2008/0257599 A1 * 10/2008 Matsushita et al. ........... 174/390
2009/0051467 A1 * 2/2009 McKinzie, III ............... 333/219
2009/0116790 A1 * 5/2009 Mossberg et al. ............... 385/37
2009/0126984 A1 * 5/2009 Saneto et al. ................. 174/350
2009/0133922 A1 * 5/2009 Okazaki et al. ............... 174/389
2009/0273527 A1 * 11/2009 Behdad ......................... 343/705
2009/0283726 A1 * 11/2009 Mizoguchi et al. ........... 252/582

FOREIGN PATENT DOCUMENTS

WO WO 2006035912 A1 * 4/2006
WO WO 2006062160 A1 * 6/2006

* cited by examiner

*Primary Examiner* — Timothy Thompson
*Assistant Examiner* — Nathan Milakovich
(74) *Attorney, Agent, or Firm* — Armstrong Teasdale LLP

(57) ABSTRACT

An apparatus having a reduced reflection from its surface includes a dielectric material and a capacitive circuit analog sheet buried within the dielectric material and configured to produce a reflection that adds out of phase with a reflection from an incident side of the dielectric material. The capacitive circuit analog sheet comprises conductive patches configured to have high impedance for transverse magnetic (TM) polarization.

10 Claims, 7 Drawing Sheets

TM
E
TE
12
104
z
y
106
100
101
10

ANTIREFLECTIVE APPARATUS WITH ANISOTROPIC CAPACITIVE CIRCUIT ANALOG SHEETS

BACKGROUND OF THE DISCLOSURE

The field of the disclosure relates generally to the transmission of electromagnetic radiation and more particularly to methods and apparatus for reducing loss of such radiation incident on dielectric materials at grazing angles.

When electromagnetic energy is incident upon a dielectric interface at a shallow angle, very little power actually enters the dielectric, particularly for polarizations perpendicular to the plane of incidence (TE). For example, when a dielectric having a dielectric constant of 4.86 (ZnS) is used with incident electromagnetic energy striking the dielectric at 80 degrees off normal, only 30% of the electromagnetic energy actually enters the dielectric. The remaining 70% of the energy is reflected away.

Several conventional anti-reflection techniques are known. These known techniques include dielectric stacks, matching layers and gradients that reduce overall polarizations. Low dielectric constant materials are needed for all of these techniques, although the techniques are equally applicable for various materials and frequencies.

In one known technique, the dielectric constant of a dielectric interface (such as, but not limited to, an RF radome, an IR window, or optical window) is graduated from that of free space to that of a dielectric material being matched. This type of graduation provides transmission over a relatively broad band of wavelengths. In a second known technique, the thickness and dielectric constant of a matching layer is selected so that a reflection from the incident surface of the matching layer exactly cancels that from the interface between the matching layer and the dielectric material being matched, thus producing maximum transmission of electromagnetic radiation into the dielectric material being matched. This matching by cancellation is performed using an off angle equivalent of a quarter wave transformer. Since it is a cancellation technique, the thickness of the dielectric layer depends upon the wavelength (frequency) of operation.

Other finite dielectric thickness techniques are known that cancel reflections from both interface sides of a dielectric material being matched. These techniques, such as those commonly used in radomes, set strict restrictions on the dielectric thickness being matched and do not necessarily maximize power transfer into a dielectric material.

The first two known solutions presented above depend upon materials having dielectric constants that are lower than those of the dielectric material being matched. However, low dielectric constant materials are inherently fragile and cannot be easily engineered. At extreme grazing angles, all dielectric coatings fail and reflect strongly as there are relatively few materials having extremely low dielectric constants and those that do have very poor physical characteristics. The quarter wave technique is very narrow banded and depends upon the availability of a material that must have a low dielectric constant that can be engineered to a particular value. In addition, to have good transmission characteristics, the materials must also have very low loss. As such, there is still an unmet need for coatings and materials that overcome the above described shortcomings.

SUMMARY OF THE DISCLOSURE

In one aspect, the present disclosure provides a configuration for an apparatus having a reduced reflection from its surface. The apparatus includes a dielectric material and a capacitive circuit analog sheet buried within the dielectric material and configured to produce a reflection that adds out of phase with a reflection from an incident side of the dielectric material. The capacitive circuit analog sheet comprises conductive patches configured to have high impedance for transverse magnetic (TM) polarization.

In another aspect, the present disclosure provides a configuration of method for making an apparatus having a reduced reflection from its surface. The method includes fabricating a capacitive circuit analog sheet on a dielectric material and covering the capacitive circuit analog sheet with additional dielectric material. The capacitive circuit analog sheet is configured to produce a reflection that adds out phase with a reflection from an incident side of the dielectric material.

In yet another aspect, the present disclosure provides another configuration of a method for making an apparatus having a reduced reflection from its surface. This method includes depositing a single layer of patterned gold patches on a zinc sulfide substrate, wherein the deposited gold has a thickness of between 0.06 to 0.1 microns, and depositing a layer of zinc sulfide on top of the deposited gold, wherein the thickness of the deposited zinc sulfide layer is 1.46 microns.

Configurations such as those above provide general solutions to antireflection problems that need not be specific to any one band or selected bands of interest. Configurations can be produced using low loss materials that can be applied to any wavelength band of interest. Such configurations provide a method for reducing reflections, while at the same time providing a smooth top coat of unrestricted dielectric constant. A large area coating can be applied that is robust and will not degrade when exposed to the environment, due to the antireflection coating being imbedded in the coating stack up.

DETAILED DESCRIPTION OF THE DISCLOSURE

Figure 1:
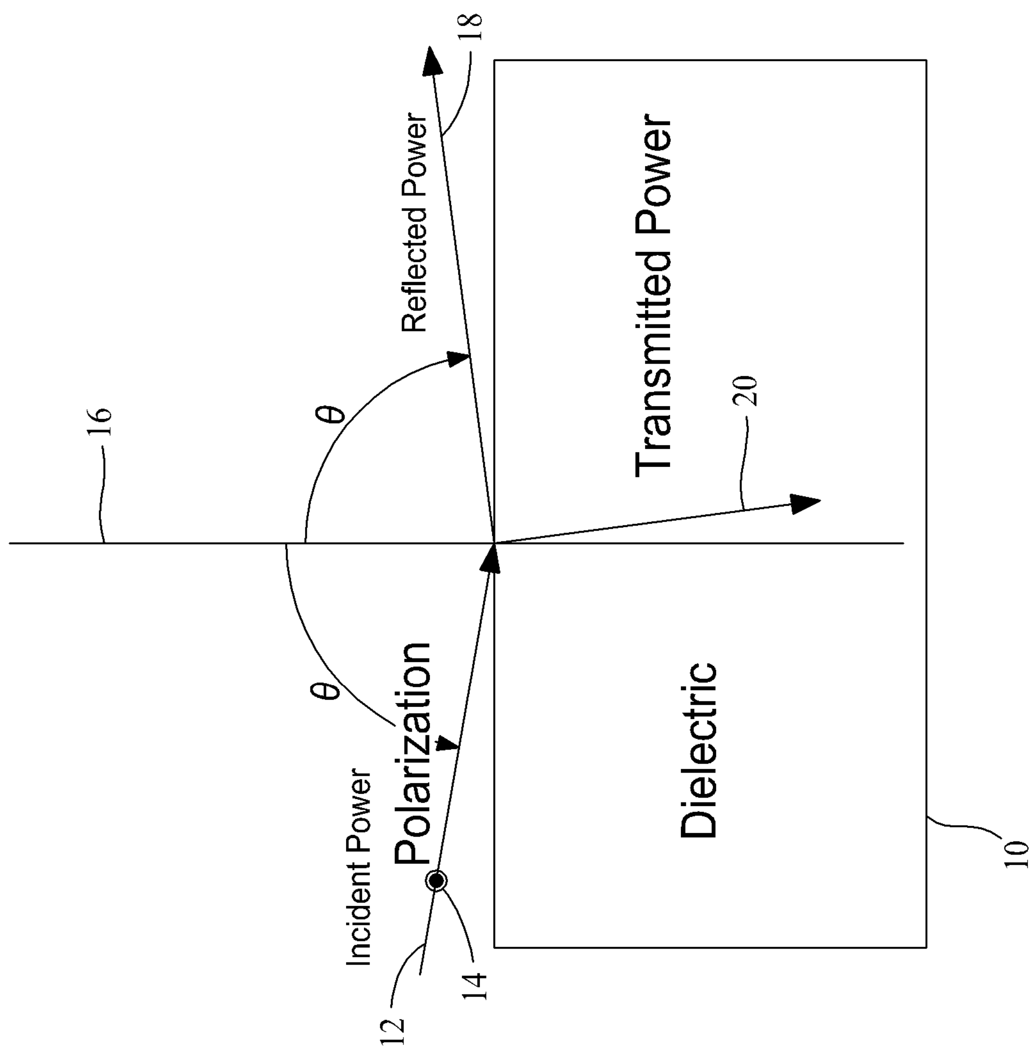
FIG. 1 is a diagram provided to aid in defining some of the terms used herein.

Some of the terms used herein are defined with reference to FIG. 1, which is a cross-section elevation view of a dielectric 10, showing incident electromagnetic radiation 12 having a polarization vector 14. The direction of polarization will be defined as necessary for each example. The angle at which the incident power of electromagnetic radiation 12 strikes dielectric 10 is defined as θ with respect to normal vector 16. Reflected power 18 results from electromagnetic radiation 12 striking dielectric 10 at a grazing angle, and only a fraction of incident power becomes transmitted power 20 through dielectric 10.

Figure 2:
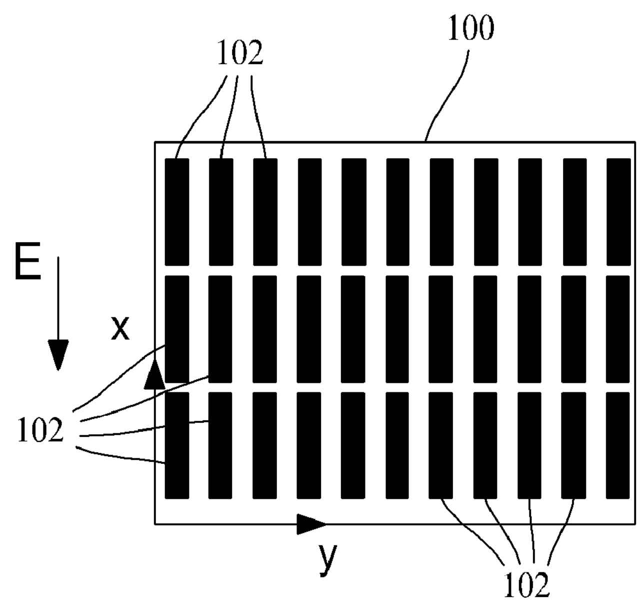
FIG. 2 is a top view of a capacitive circuit analog sheet.
Figure 3:
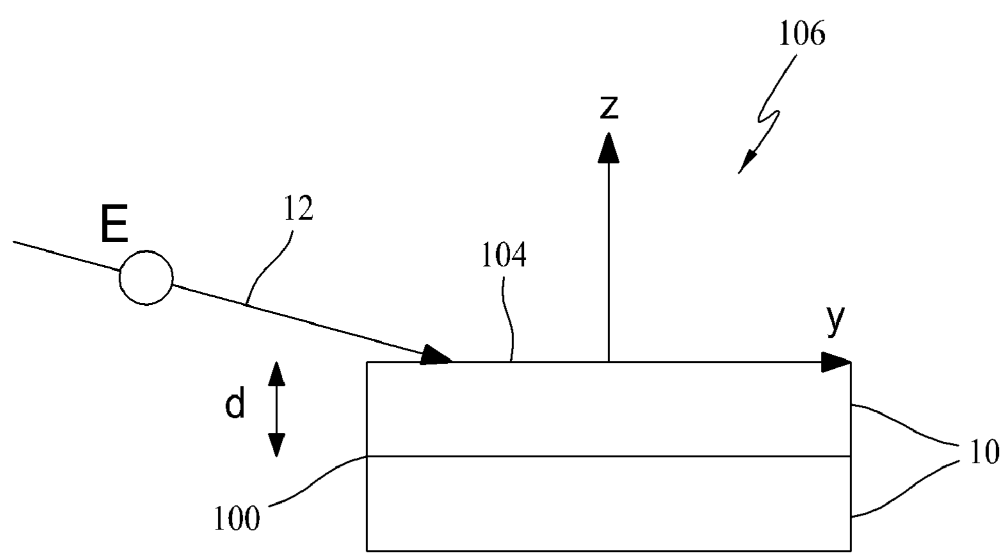
FIG. 3 is a side view of an antireflective apparatus having the capacitive circuit analog sheet of FIG. 2 embedded or buried therein.

In at least one configuration and referring to FIG. 2 and FIG. 3, a capacitive circuit analog sheet 100 is buried within a dielectric 10 to produce a reflection that adds out of phase with a reflection from a face sheet reflection. Capacitive circuit analog sheet 100 comprises (or consists entirely of) low loss electrically conductive (e.g., metallic) patches 102 buried a distance d below incident surface 104 of dielectric 10. For example, in some configurations, elongate metallic patches 102 are deposited (e.g., vapor deposited) on a surface of a dielectric material 10 and an additional layer of dielectric material 10 of width d is formed on top of metallic patches 102, and, in some configurations, between them, as well. Metallic patches 102 are elongate because there are two different polarizations to incoming radiation 12. When the electric field of electromagnetic radiation 12 is polarized out of the plane of FIG. 3, electromagnetic radiation 12 typically has the most difficulty entering dielectric 10. When the electric field of electromagnetic radiation 12 is polarized in the plane of FIG. 3, electromagnetic radiation 12 typically has the least difficulty entering dielectric 10. Metallic patches 102 are elongate to avoid interfering with the transmission of electromagnetic radiation 12 in the latter case. Thus, structure 106 is anisotropic.

Figure 4:
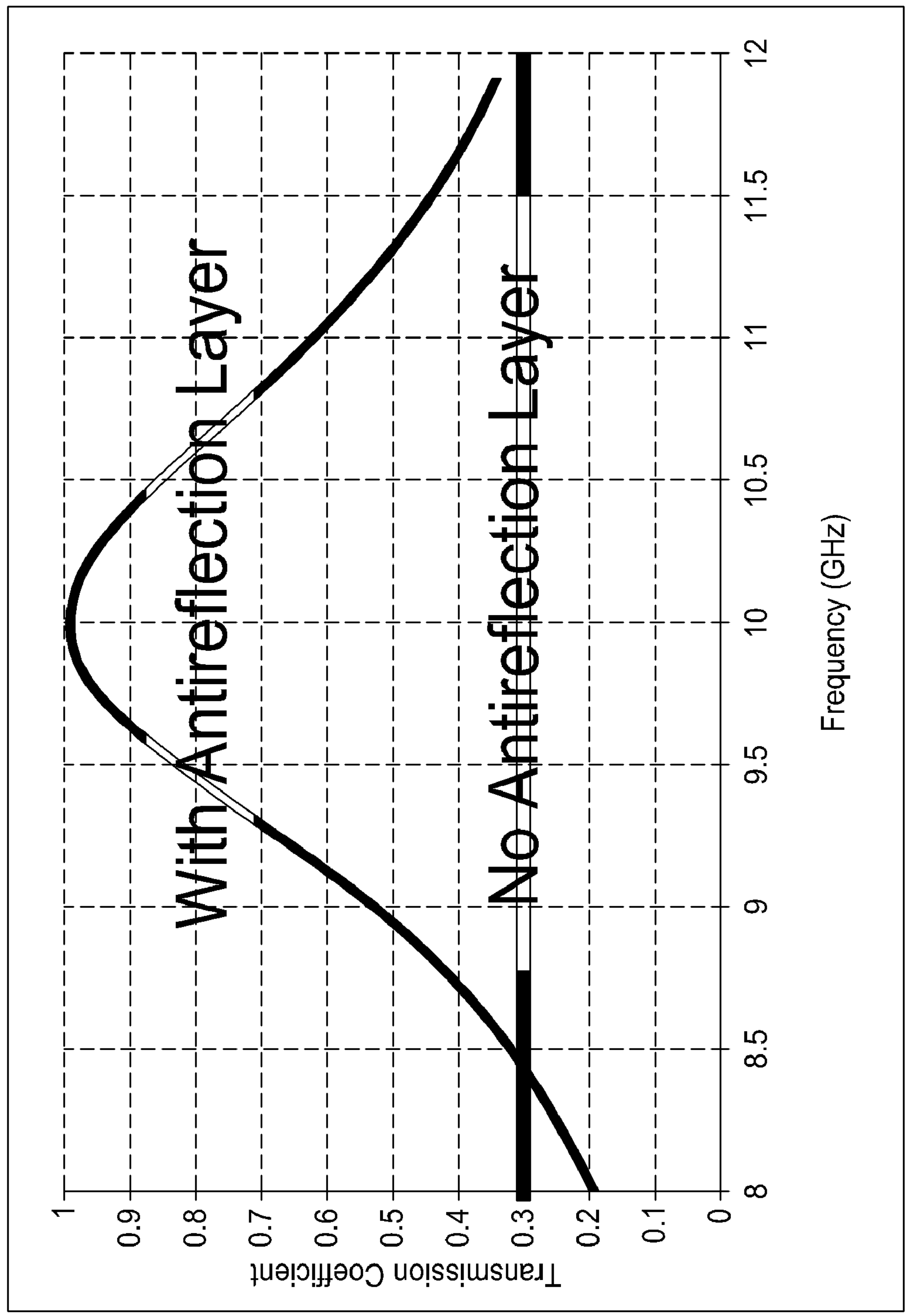
FIG. 4 is a graph showing the transmission improvement provided by the antireflective apparatus as compared to a dielectric having no embedded capacitive circuit analog sheet.

Metallic patches 102 are configured to present a very high impedance for a transverse magnetic (TM) polarized component of incident electromagnetic radiation 12 where reflections near a grazing angle are not a severe problem. Wideband transmission of electromagnetic radiation 12 is thus significantly improved over the same dielectric 10 without capacitive circuit analog sheet 100. For example, a configuration operable at 10 GHz may have d=0.1722 in (0.4374 cm), a dielectric constant of dielectric 10 of $\epsilon$=4.86, and metallic patches 102 configured to have a capacitance $C_s$=0.256 pF-sq (x-directed). Referring to FIG. 4, compared to dielectric 10 without an antireflection layer, transmission coefficient improvements can be seen over a wide bandwidth centered at 10 GHz when the antireflection layer (i.e., capacitive circuit analog sheet 100) is present.

Figure 5:
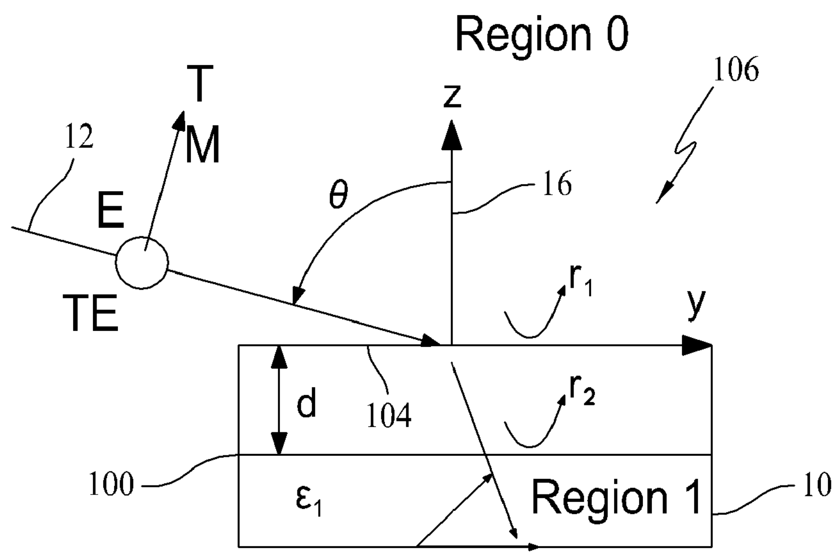
FIG. 5 is a representation of the geometry and terminology used in determining optimum fabrication parameters for one configuration of an antireflective apparatus.

In the other polarization direction, metallic patches 102 are separated so as to have little effect on the composite structure, i.e., the capacitive circuit analog sheet presents a high impedance to the transverse electric (TE) polarized component of incident electromagnetic radiation. To determine optimum surface capacitance of capacitive circuit analog sheet 100 and its depth within dielectric 10, consider the geometry of FIG. 5, where the subscript 0 denotes region 0 (which can be free space or air) and subscript 1 denotes region 1 (which is dielectric 10). Reflections $r_1$ and $r_2$ denote reflections from incident surface 104 and capacitive circuit analog sheet 100, respectively. Two independent solutions are given for the TE and TM cases.

The free space propagation constant is written as $$k_0 = \frac{2\pi f}{c} = \frac{\omega}{c},$$

where f is frequency and c is the speed of light in free space.

When propagating at an angle, the propagation constants normal to the surface of the interface are written as $$k_{z0}=k_0 \cos(\theta) \text{ and}$$

$$k_{z1}=k_0\sqrt{\epsilon_1-\sin^2(\theta)}.$$

In transverse electric (TE) cases, the infinitesimal reflection coefficient into a half space is written as $$r_1 = \frac{k_{z0} - k_{z1}}{k_{z0} + k_{z1}}.$$

In some configurations, the desired sheet reactance is written as $$X_s^2 = \frac{\omega^2\mu_0^2\lfloor 1 - |r_1|^2\rfloor}{4|r_1|^2k_{z1}^2},$$

where $\mu_0$ is the permeability of free space=$4\pi\times10^{-7}$ H/m. Thus, the desired sheet capacitance is written $$C_s = -\frac{1}{\omega X_s}, \text{ and}$$

$$r_2 = \frac{-\omega\mu_0}{\omega\mu_0 + 2ik_{z1}X_s}.$$

The desired depth of the sheet is written $$d_j = \frac{\pi(1+2j) - \Delta\phi}{2k_{z1}};\ j = 0, 1, 2, 3, K,$$

where $$\Delta\phi = \text{phase}\left(\frac{r_1}{r_2}\right).$$

Note that depths $d_j$ that produce no reflections are not unique.

In transverse magnetic (TM) cases, the infinitesimal reflection coefficient into a half space is written as $$r_1 = \frac{k_{z0} - \frac{k_{z1}}{\varepsilon_1}}{k_{z0} + \frac{k_{z1}}{\varepsilon_1}}.$$

The desired reactance of the sheet for this case is written $$X_s^2 = \frac{k_{z1}^2\lfloor 1 - |r_1|^2\rfloor}{4\omega^2\varepsilon_0^2\varepsilon_1^2|r_1|^2},$$

where $\epsilon_0$ is the permeability of free space=$8.854\times10^{-12}$ F/m, and $$r_2 = \frac{k_{z1}}{k_{z1} = 2iX_s\omega\varepsilon_0\varepsilon_1}$$

with the rest of the expressions written identically. The TE and TM cases have different depths because the phases of the reflection coefficients (r) differ.

In some other configurations designed for single polarization performance, an isotropic version of the capacitive circuit analog sheet is used.

Figure 6:
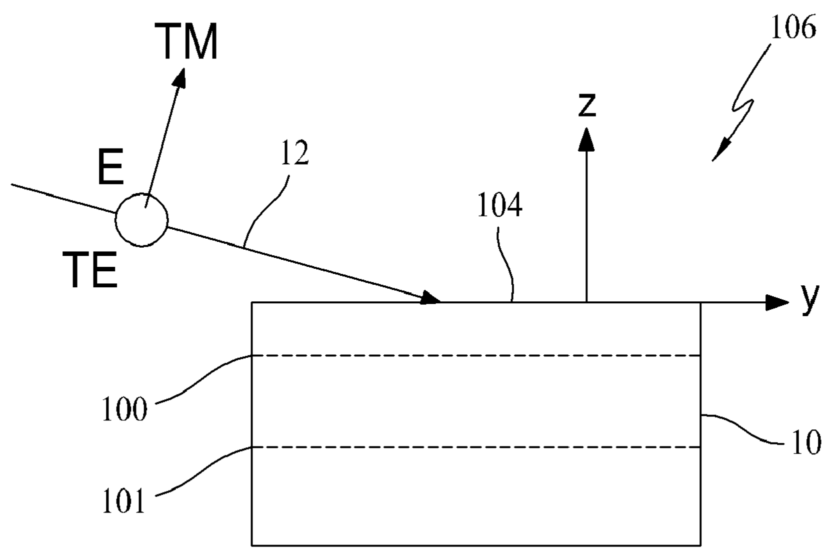
FIG. 6 is a side view of an antireflective apparatus having two buried capacitive circuit analog sheets embedded within.
Figure 7:
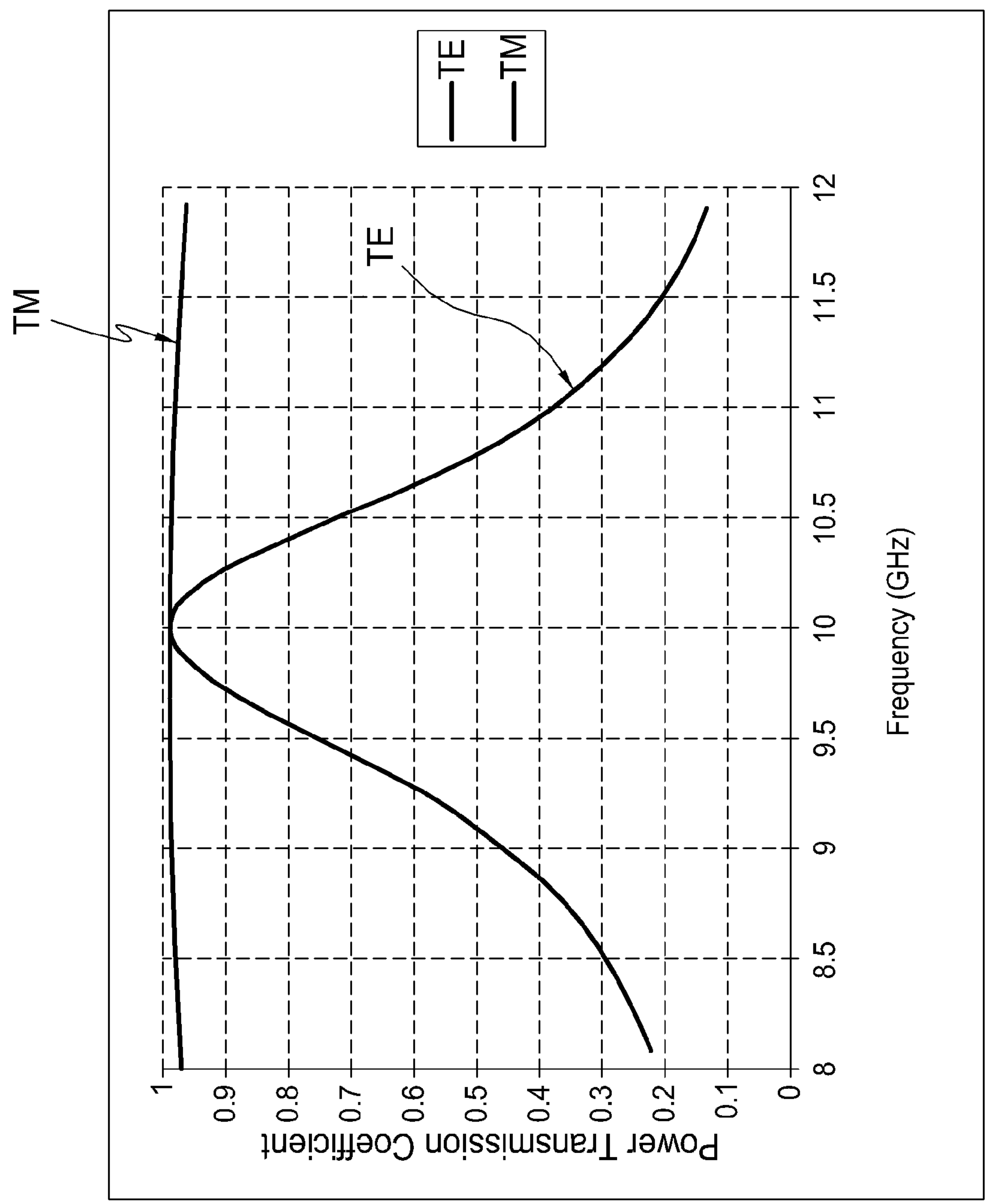
FIG. 7 is a graph showing the power transmission coefficient for the apparatus of FIG. 6 for both transverse magnetic (TM) and transverse electric (TE) polarizations.

To improve both TM transmission and TE transmission and referring to FIG. 6, two capacitive circuit analog sheets 100 and 101 can be embedded in dielectric 10 at different depths. Each of the two capacitive circuit analog sheets 100, 101 is anisotropic in a direction perpendicular to the other. In one configuration, a top-most capacitive circuit analog sheet 100 (i.e., top-most relative to the incident electromagnetic radiation 12) operates only on TM polarization, whereas the other capacitive circuit analog sheet 101 operates on TE polarization. In a configuration operating at 10 GHz and having a dielectric constant of dielectric 10 of $\epsilon$=4.86, with the depth of sheet 100 at 0.055 in (0.13475 mm) and capacitance $C_s$=0.091 pF-sq and high impedance out of the page, and the depth of sheet 101 at 0.1722 in (0.4374 mm) and capacitance $C_s$=0.256 pF-sq and high impedance to the right (i.e., along the y-axis), the results shown in FIG. 7 are achieved.

Optimum embedding depths of capacitive circuit analog sheets are set by design wavelengths as well as polarization in various configurations. For even broader band operation, two or more capacitive circuit analog sheets can be deposited at various depths within the structure.

Although some configurations of the present disclosure are limited to RF frequencies, other configurations use very small nanostructures in capacitive circuit analog sheets to operate at long wave infrared (IR) wavelengths. The use of even smaller structures can allow operation at visual wavelengths. For example, if patches 102 are comprised or consist of superconducting nanoparticles, losses could be completely eliminated. Devices that use superconductive nanoparticles do not necessarily have to operate terrestrially, but could be used on spacecraft or deep space probes, where temperatures are low enough to enable superconduction.

In some configurations, single layer capacitive circuit analog sheets have been successfully fabricated with known e-beam photolithography and/or known vacuum deposition methods that operate most effectively around long wave infrared (10 micron) wavelengths. Also in some configurations, dual polarization anti-reflection coatings operating at 10 microns can be fabricated with similar processes. At shorter wavelengths and into the visible region (400-700 nm), some configurations use e-beam lithography to fabricate at the required dimensions. Other techniques aside from e-beam lithography can be used to fabricate devices operable at visible through long wave IR wavelengths. For example, anti-reflective coatings may be fabricated using any suitable soft lithography process. Additionally, with recent advancements in self assembled structures, structures for anti-reflective coatings suitable for visible light can be used in some configurations. Growth of gold and silver nanorods/quantum dots can be used and self assembly of materials like these has been demonstrated. Self assembly, soft lithography, and other related techniques can be used for large area, moderate through-put manufacturing. For structures designed to be transparent at lower radio frequency, copper can be use along with known printed circuit etching techniques for fabricating metallic patches 102.

It will thus be seen that various configurations can be used to provide a method for effectively reducing reflections created at the surface of dissimilar materials. Through processes like that of e-beam lithography, electro-plating and traditional vacuum deposition, a variety of configurations that reduce the overall reflection or that specifically target a specific polarization can be fabricated.

Figure 8:
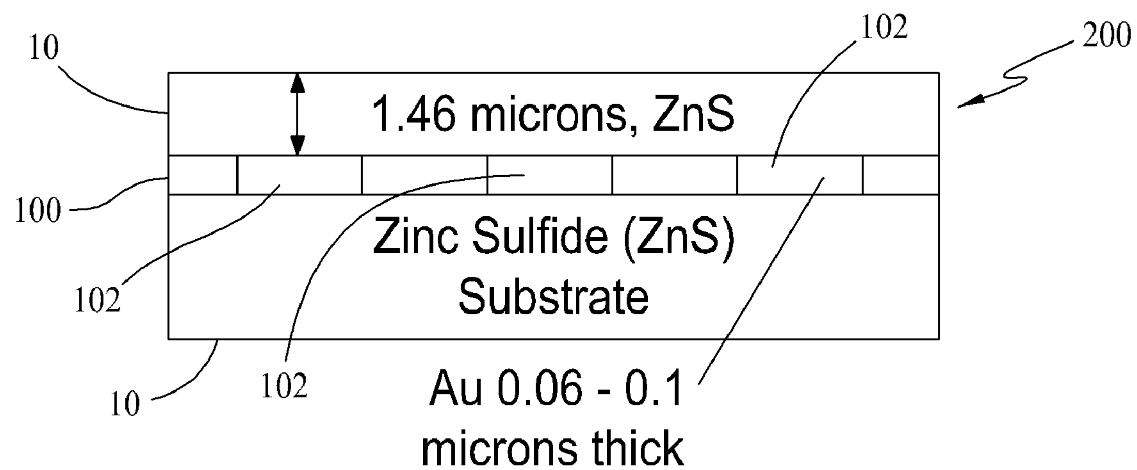
FIG. 8 is a side view of a configuration of antireflective device having ZnS as its dielectric and gold as the conductive patches.
Figure 9:
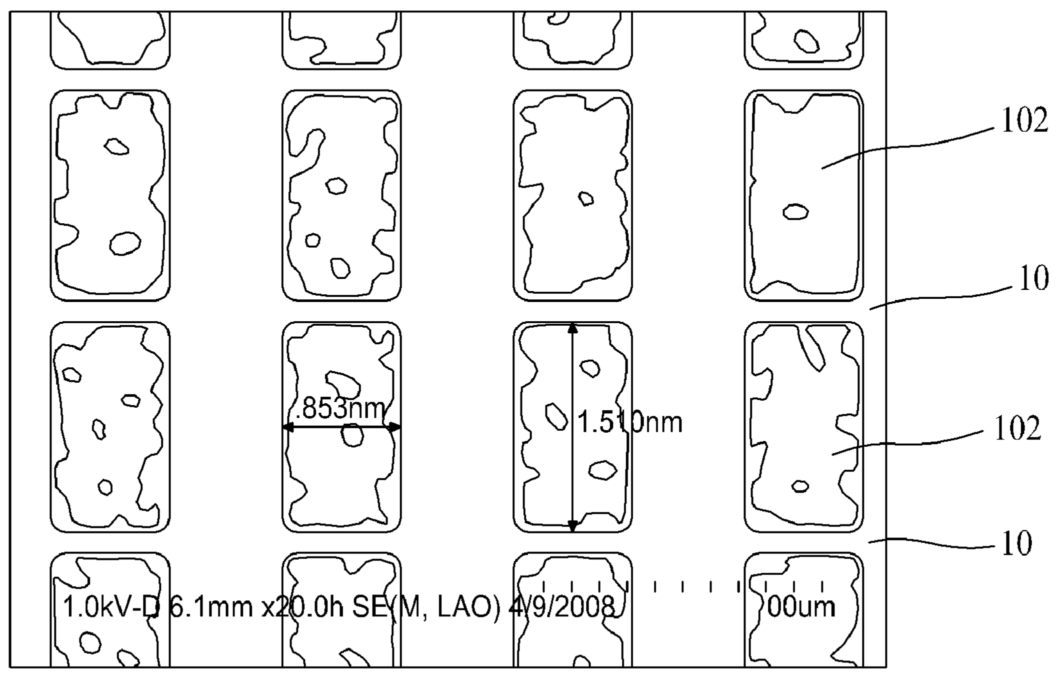
FIG. 9 is a photomicrograph of a configuration of capacitive circuit analog sheet having gold micro-patches nominally having dimensions 0.85 microns by 1.53 microns.

For example and referring to FIGS. 8 and 9, a long wave infrared configuration 200 has been fabricated that operates near 10 microns. A single layer of patterned gold (Au) patches 102 was deposited on a zinc sulfide (ZnS) substrate and a thin ZnS layer was deposited on top of the Au. The thickness of the deposited gold was sufficient to reduce resistance and thus losses in the fabricated structure, e.g., 0.06 to 0.1 microns. The ZnS—Au coating was designed to have optimal operation at 10 microns, in one polarization, therefore gold metal was selected for its low resistance (ohms/square) in the long wave band. A top coating of ZnS of about 1.46 microns was then deposited on top of the patterned gold. This design is the scaled version of the 10 GHz design presented above.

Antireflective coating configurations can also use gold patches fabricated via e-beam lithography, with spacing between patches 102 of as little as 1700 angstroms.

Figure 10:
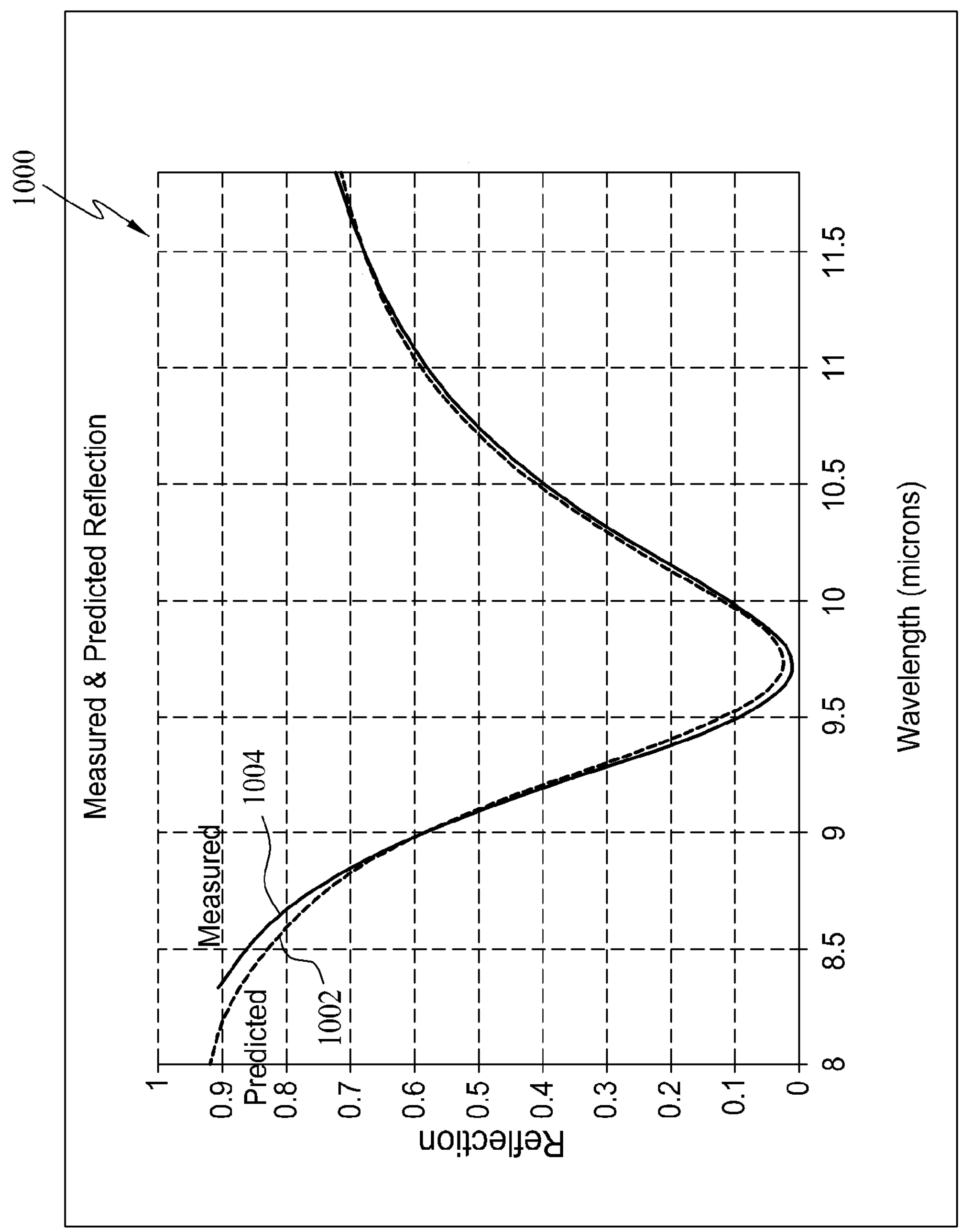
FIG. 10 is a graph showing predicted and measured reflections from the configuration shown in FIG. 9 when used with a black painted backing (to reduce reflections from the backing).

FIG. 10 is a graph 1000 showing predicted performance 1002 and measured performance 1004 of the example configuration of FIG. 9. Because the antireflection coating acted only on one side of the example configuration, a lower surface of the configuration was painted black so that the reflection measurement was not corrupted from the lower surface reflection.

Coating configurations designed to perform in the visible region would be about 1/15 of the dimensions used for an antireflection coating done at 10 microns and would require a critical dimension of 100 angstroms and gold patches of approximately 1000 by 560 angstroms. However, gold patches have been made at dimensions similar or smaller than these dimensions.

In another configuration, a method for making an apparatus 106 having a reduced reflection 18 from its surface 104 is provided. This method includes fabricating a capacitive circuit analog sheet 100 on a dielectric material 10 and covering the capacitive circuit analog sheet 100 with additional dielectric material 10, wherein the capacitive circuit analog sheet 100 is configured to produce a reflection $r_2$ that adds out phase with a reflection $r_1$ from an incident side 104 of the dielectric material 10. In some configurations, the method further includes fabricating a second capacitive circuit analog sheet 101 on the dielectric material and covering the second capacitive circuit analog sheet 101 with still more dielectric material 10 to produce reflections that add out of phase with a reflection from an incident side 104 of the dielectric material 10.

In some configurations, fabricating a capacitive circuit analog sheet 100 further comprises depositing metallic patches 102 on the dielectric material. The metallic patches 102 may comprise gold, and may be fabricated using at least one of e-beam photolithography or vacuum deposition to deposit the metallic patches 102 on the dielectric material 10. In some configurations, the metallic patches comprise gold or silver nanorods or quantum dots. Also, the dielectric material 10 comprises ZnS in some configurations.

This written description uses examples to explain the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus having a reduced reflection from its surface, said apparatus comprising:

a dielectric material;

a first anisotropic capacitive circuit analog sheet buried within the dielectric material and configured to produce a first reflection that adds out of phase with a reflection from an incident side of the dielectric material; and a second anisotropic capacitive circuit analog sheet buried within the dielectric material and configured to produce a second reflection that adds out of phase with the reflection from the incident side of the dielectric material, wherein at least one of the first anisotropic capacitive circuit analog sheet and the second anisotropic capacitive circuit analog sheet comprises conductive patches configured to have high impedance for transverse magnetic (TM) polarization.

2. An apparatus in accordance with claim 1, wherein the first anisotropic capacitive circuit analog sheet operates predominantly on TM polarization and the second anisotropic capacitive circuit analog sheet operates predominantly on transverse electric (TE) polarization.

3. An apparatus in accordance with claim 1 wherein the conductive patches comprise elongate metallic patches.

4. An apparatus in accordance with claim 3 wherein the metallic patches comprise gold.

5. An apparatus in accordance with claim 4 wherein the dielectric material comprises zinc sulfide (ZnS).

6. An apparatus in accordance with claim 3 wherein at least one of the first anisotropic capacitive circuit analog sheet and the second anisotropic capacitive circuit analog sheet comprises superconductive nanoparticles.

7. An apparatus in accordance with claim 3 fabricated using e-beam photolithography, vacuum deposition, or a combination thereof.

8. An apparatus in accordance with claim 3 wherein at least one of the first anisotropic capacitive circuit analog sheet and the second anisotropic capacitive circuit analog sheet comprises gold or silver in quantum dot or nanorod form.

9. An apparatus in accordance with claim 3 wherein at least one of the first anisotropic capacitive circuit analog sheet and the second anisotropic capacitive circuit analog sheet comprises copper.

10. An apparatus in accordance with claim 1 having a center frequency of 10 GHz.

* * * * *